US006284998B1

(12) United States Patent
Sinkunas et al.

(10) Patent No.: US 6,284,998 B1
(45) Date of Patent: Sep. 4, 2001

(54) METHOD FOR LASER SOLDERING A THREE DIMENSIONAL COMPONENT

(75) Inventors: Peter Joseph Sinkunas, Canton; Andrew Zachary Glovatsky, Plymouth; Bernard Allen Meyer, Taylor; Zhong-You Joe Shi, Ann Arbor; Myron Lemecha, Dearborn Heights; Rexanne M. Coyner, Farmington Hills, all of MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 0 days.

(21) Appl. No.: 09/452,241

(22) Filed: Dec. 1, 1999

Related U.S. Application Data

(63) Continuation-in-part of application No. 09/096,828, filed on Jun. 12, 1998, now abandoned.

(51) Int. Cl.$^7$ .............................. B23K 26/20; H05K 3/34
(52) U.S. Cl. .............................. 219/121.64; 228/180.22; 228/234.1
(58) Field of Search ........................... 219/121.6, 121.63, 219/121.64, 121.66, 121.85; 228/180.22, 234.1

(56) References Cited

U.S. PATENT DOCUMENTS

| 3,934,073 | 1/1976 | Ardezzone . |
| 4,562,637 | 1/1986 | Kushima et al. . |
| 4,889,275 | * 12/1989 | Mullen, III et al. ............... 228/248.1 |
| 4,926,022 | 5/1990 | Freedman . |
| 4,963,714 | 10/1990 | Adamski et al. . |
| 5,021,630 | * 6/1991 | Benko et al. ..................... 219/121.64 |
| 5,275,328 | * 1/1994 | Lodge et al. ........................... 228/209 |
| 5,282,565 | * 2/1994 | Melton .............................. 228/180.22 |
| 5,598,321 | 1/1997 | Mostafazadeh et al. . |
| 5,946,597 | * 8/1999 | Miura et al. ..................... 228/180.22 |

FOREIGN PATENT DOCUMENTS

| 2 244 374 A | 11/1991 | (GB) . |
| 2 261 620 A | 5/1993 | (GB) . |
| 62-291934 A | 6/1986 | (JP) . |
| 2-6055 A | 1/1990 | (JP) . |
| 0-260820 A | 3/1996 | (JP) . |

OTHER PUBLICATIONS

Beckett et al., "The application of semiconductor diode lasers to the soldering of elecgtronic components," Optical and Quantum Electronics, vol. 27, No. 12, pp. 1303–1311, Dec. 1995.

* cited by examiner

Primary Examiner—Samuel M. Heinrich
(74) Attorney, Agent, or Firm—John Kajander

(57) ABSTRACT

There is disclosed herein a method for laser soldering, comprising the steps of: (a) providing an electronic component 10 having at least two terminations thereon; a dielectric substrate 14 having a first surface 16 on a first side thereof, a second surface on a second side thereof, and at least two mounting pads 24 arranged on the first surface 16 in matched relation with the terminations of the electronic component 10; and a diode laser 50; (b) depositing solder paste atop the mounting pads 24; (c) placing the electronic component 10 atop the substrate 14 such that each termination rests generally atop its respective mounting pad 24; and (d) directing laser energy 70 from the diode laser 50 to at least one of the mounting pads 24 from the second side of the substrate 14 for a predetermined time, such that the solder paste atop the at least one of the mounting pads 24 is melted.

27 Claims, 4 Drawing Sheets

METHOD FOR LASER SOLDERING A THREE DIMENSIONAL COMPONENT

Related Application

The present invention is a continuation-in-part of U.S. application Ser. No. 09/096,828, filed on Jun. 12, 1998, now abondoned.

BACKGROUND

1. Field of the Invention

The present invention relates generally to laser soldering, and more particularly to a method for laser soldering electronic components to a three dimensional circuit board substrate.

2. Disclosure Information

Electronic components are typically connected to circuit boards using either conventional reflow or wave soldering. An alternative and heretofore less widely used method is laser soldering, illustrated in FIG. 1. Laser soldering is often preferred over conventional reflow processing when the substrate is made of a material that is more temperature-sensitive than conventional laminated FR4 glass-epoxy, such as a low melting point polymer or a thin flex circuit.

In conventional laser soldering, an electronic component 10 is placed atop a dielectric substrate 14 with the component terminations 12 resting atop solder pasted mounting pads 24, and a laser beam 70 from a YAG, Nd:YAG, diode, or other laser 50 is directed at one or more mounting pads 24 and/or solder depositions 26, in order to melt and reflow the solder paste 26 to form solder -joints.

However, conventional laser soldering has always been limited to use with those components whose terminations remain visible after the component is mounted atop its respective solder-pasted mounting pads. These include components having conventional J-leads, gull-wing leads, or end terminations (such as in leadless chip components or LCCs) arranged about one or more sides of the component body. However, laser soldering has heretofore not been utilized on components whose terminations are arranged on an underside surface of the component, such as ball grid arrays (BGAs), pin grid arrays (PGAs), and the like. This is because the standard practice in laser soldering is to direct the laser beam 70 in a line-of-sight manner from a position above the substrate top surface 16 on which the component 10 is mounted, thus precluding its use on components whose terminations are "hidden" beneath the underside of the component when the component is mounted on its solder-pasted mounting pads. Thus, when a circuit board/substrate contains, for instance, J-lead, gull-wing, and BGA/PGA components and it is desired to use laser soldering, typical practice in this case would be to laser solder only the J-lead and gull-wing components, and to separately solder the BGAs/PGAs using a separate reflow process either before or after the laser soldering process. This requirement of a separate reflow step presents a significant drawback to the prospect of using laser soldering, not only because it requires the use of two separate soldering steps (i.e., reflow and laser soldering), but also because it typically requires the use of two separate solder pastes (i.e., one having a first melting point for the J-lead/gull-wing components, and another having a different melting point for the BGA/PGA components).

Because space is limited, housings for automotive vehicle components are continuously being reduced. Commonly, housings have several circuit boards contained therein. The multiple circuit boards take a substantial amount of space. However, further reduction in space of electrical components is desirable.

It also would be desirable to provide a method for using laser soldering with both (1) BGAs, PGAs, and other components having one or more terminations on an underside surface or a an inside surface thereof, and (2) J-lead, gull-wing, endterminated, and other such components.

SUMMARY OF THE INVENTION

The present invention overcomes the disadvantages of the prior art approaches by providing a method for laser soldering a three dimensional component having an interior portion, comprising the steps of:

providing an electronic component having at least two terminations thereon; a substantially flat dielectric substrate having a first surface on a first side thereof, a second surface on a second side thereof, and at least two mounting pads arranged on the first surface in matched relation with the terminations of the electronic component; and a diode laser;

depositing solder paste atop the mounting pads;

placing the electronic component atop the substrate such that each termination rests generally atop its respective mounting pad;

forming a three dimensional structure from said substrate; and after the step of forming a three-dimensional structure, directing laser energy from the diode laser to at least one of the mounting pads from the second side of the substrate for a predetermined time, such that the solder paste atop the at least one of the mounting pads is melted.

It is an object and advantage that the method of the present invention may be used to laser solder components having terminations on an inside surface of a three dimensional component.

Another advantage of the invention is that a housing with the electrical components therein may be formed by the circuit substrate. Thus, the size of the housing may be reduced.

Another advantage is that the method of the present invention may laser solder such components without requiring modification of the component, terminations, mounting pads, solder paste depositions, substrate, or any other aspect of the electronic circuit assembly.

Yet another advantage is that the method of the present invention may be used not only for surface mount components having terminations on an underside surface thereof, but also for any other type of surface mount or plated through-hole component.

These and other advantages, features and objects of the invention will become apparent from the drawings, detailed description and claims which follow.

DESCRIPTION OF THE PREFERRED EMBODIMENT

Figure 2:
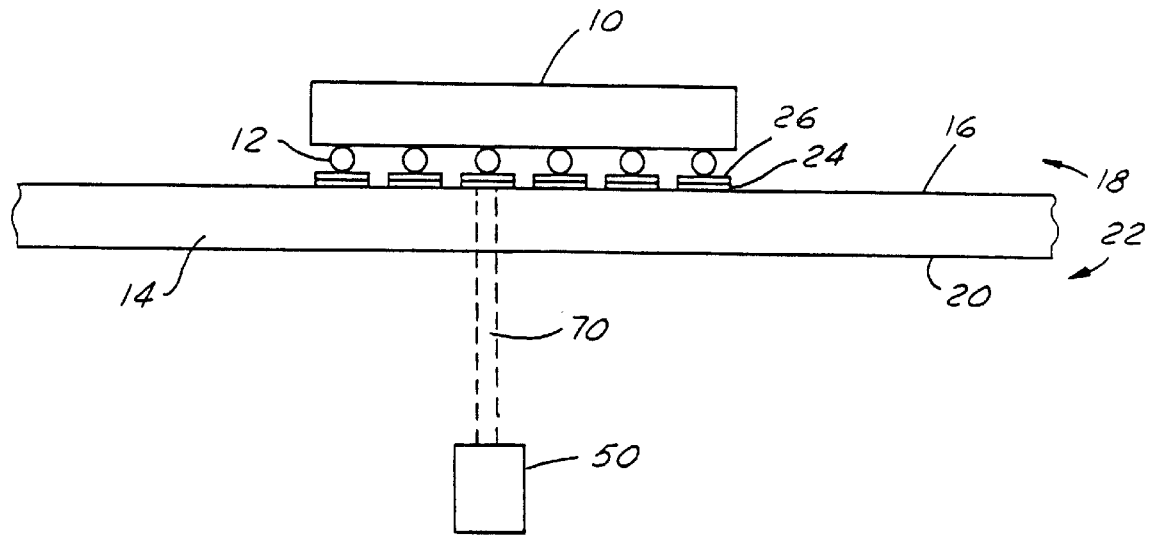
FIGS. 2–3 are side views of an electronic circuit assembly being laser soldered according to the present invention.

Referring now to the drawings, FIG. 2 shows an electronic circuit assembly being laser soldered according to a first method of the present invention. First, an electronic component 10 having at least two termination 12 thereon is provided, along with a dielectric substrate 14 having a first surface 16 on a first side 18 thereof, a second surface 20 on a second side 22 thereof, and at least two mounting pads 24 arranged on the first surface in matched relation with the terminations of the electronic component. Also provided is a diode laser 50.

To assist the reader in understanding the present invention, all reference numbers used herein are summarized in the table below, along with the elements they represent:
10=Electronic component
12=Termination
14=Dielectric substrate
16=First surface of substrate
18=First side of substrate
20=Second surface of substrate
22=Second side of substrate
24=Mounting pad
26=Solder paste deposition
50=Diode laser
52=Laser energy source
54=Light pipe
56=Amplifier
58=Laser control unit
60=Emitting aperture
62=Housing for laser system
64=Means for positioning/aiming the aperture
66=Additional optical elements (e.g., mirror)
70=Laser energy beam
74=Housing
75=Sides
76=Interior of housing
78=Heater
80=Reinforcement plate
82=Tubular structure
84=Open structure
86=First substrate
87=Second substrate
88=Flex circuit
89=Opening After the aforementioned component 10, substrate 14, and diode laser 50 are provided, the second step is to deposit solder paste 2,6 atop the mounting pads 24. This may be done by conventional squeegee/stencil "silk-screening", compression printing through a stencil, dispensing, or any other known means. Once the pads 24 have been pasted, the third step is to then place the component 10 atop the substrate 14 such that each termination 12 of the component rests generally atop its respective mounting pad 24. This is typically accomplished by one or more automated/robotic pick-and-place machines, but may also be done manually or by other known means. This step is sometimes referred to in the electronics manufacturing industry as "populating" the substrate/circuit board.

Once the two-dimensional substrate has been populated, the fourth step is to then direct laser energy 70 from the diode laser 50 to at least one of the mounting pads 24 from the second side 22 of the substrate for a predetermined amount of time, such that the solder paste 26 atop the selected mounting pads 24 is melted. Once the solder/paste is melted, the beam 70 may be turned off and/or redirected to another one or more mounting pads, thereby allowing the melted solder paste to cool and a solid solder joint to form atop each of the at least one mounting pads 24 immediately after the fourth step. This provides a solder joint mechanically and electrically connecting the respective component termination 12 with its respective mounting pad 24.

Figure 1:
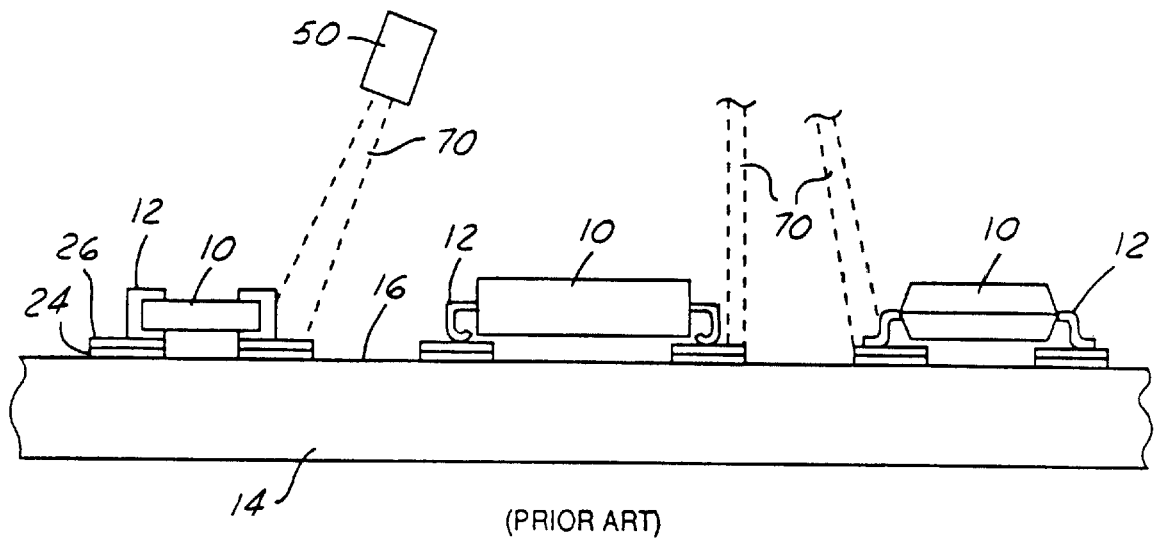
FIG. 1 is a side view of an electronic circuit assembly being laser soldered according to the prior art.

This approach of lasing the mounting pad/solder paste 24/26 through the substrate 14 from the second side 22—i.e., from the side of the substrate opposite that on which a given component 10 is mounted—is completely counter-intuitive with respect to any conventional, prior art approach. As previously mentioned, the conventional approach for laser soldering is to lase line-of-sight from the same side of the substrate on which a component is mounted, as in FIG. 1. However, the laser energy produced by diode lasers is of a particular range of wavelengths such that the energy is readily absorbed by metals—such as the mounting pads 24 and the solder particles in the solder paste 26—but is not readily absorbed by non-metallic, polymeric materials such as the substrate. This property of diode laser energy allows the laser beam to be directed through the substrate without damaging or otherwise deleteriously affecting the substrate, while allowing as much as 95% or more of the laser energy to pass through the substrate and to be delivered to the underside of the metallic mounting pads 24 and solder paste 26.

Diode lasers 50 are available in a variety of power configurations, generally from as little as 3 Watts to as much as 1000 Watts, with 3 to 40 Watts being most common. Because of the particular semiconductor nature of such devices, diode lasers produce a beam 70 whose wavelength is generally between 400 and 11,000 nm (0.4 to 11 IIn), with 850 to 1000 nm being most typical. Given these power and wavelength ranges, along with the thickness and material type of the substrate to be lased, as well as the volume and melting point of the solder paste, the predetermined time required for lasing the mounting pad(s) so as to melt the solder paste can be determined. This time may also be affected by the temperature of the mounting pads 24 and solder paste 26 prior to being lased—if the pads/paste have been pre-heated prior to lasing, such as by shuttling the populated circuit board/substrate through a preheat oven, then less time and/or laser energy would be required than if the pre-heating were not provided. Another factor affecting lase time (and/or laser energy output required) is the mass/thickness of the mounting pad(s) to be lased at a given time, and the degree to which the laser beam is focused/diffused with respect to the mounting pad(s). Typically, the time required to lase a given pad 24 in order to melt the paste 26 thereon is generally between 50 and 1000 milliseconds, with 300 to 1000 milliseconds being most typical.

For example, tests were conducted on several 3-mil-thick substrates of polyethylene naphthalate (PEN) film and polyimide (PI) film, each with standard copper mounting pads and circuit traces thereon. Each mounting pad was covered with a nominal deposition of eutectic tin/lead solder paste. Various BGA components with gold ball terminations were successfully laser soldered to the mounting pads on the PEN and PI films with acceptable solder joints resulting, using a 12 Watt, commercially available diode laser which produced a 960- to 980-nm beam. In the tests, only one mounting pad was soldered at a time, requiring about 500 milliseconds of lase time per mounting pad to produce acceptably reflowed solder joints. Tests were further conducted on 3- to 8-mil-thick substrates of styrene-acrylonitrile (SAN), polyethylene terephthalate (PET), polyamide 6 (PA-6), polyamide 6/6 (PA-6/6), and polycarbonate (PC) using the same laser system, comparable wattage/wavelength settings, and lase times of 300 to 1000 milliseconds per mounting pad, with acceptable solder joints formed in each case.

The method of the present invention is particularly well suited for use with surface mount components 10 having terminations 12 on an underside surface thereof, such as EGAs and PGAs. However, the method may also be used with other surface mount components (e.g., J-leaded, gull-winged, and end-terminated components), as well as non-surface mount components such as dual in-line package (DIP) devices, conventional leaded resistors and capacitors, and other plated through-hole (PTH) components, as illustrated in FIG. 3.

The substrate 14 may be made from a wide variety of non-metallic, non-ceramic materials, such as epoxy, rigid to semi-rigid molded, cast, or laminated polymers (e.g., polystyrene, polypropylene, acrylonitrile-butadiene-styrene (ABS), polyurethane, polysulfone, polyethersulfone, polyam-de), or flexible molded, cast, or laminated polymers (e.g., PI, polyetherimide, polyester, polyamide). Polymers used for the substrate may be thermoplastic or thermoset. It is preferable that the polymer material be unfilled or only minimally filled with fiber, talc, or other fillers, in order to maximize the transmissibility of laser energy through the substrate.

Figure 4:
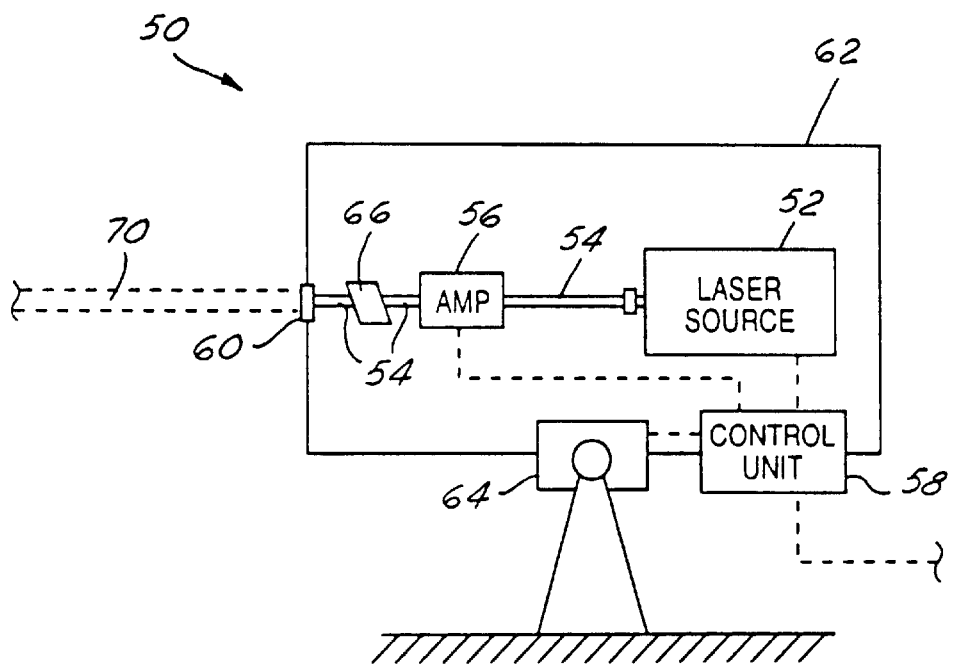
FIG. 4 is a schematic of a diode laser system which may be used in conjunction with the present invention.

The diode laser 50 may comprise multiple elements or sub-systems, such as a source 52, light pipe 54, amplifier 56, central control unit 58, and emitting aperture 60 from which the beam exits, as illustrated in FIG. 4. The laser system 50 may also include: a housing 62 or other structural member for supporting one or more laser system elements; means 64 for positioning/orienting/aiming the emitting aperture 60; and/or additional optical elements 66 such as mirrors, lenses, beam splitters, collectors, amplifiers, conditioners, filters, optical connectors, additional light pipes, and the like. The aiming/positioning means 64 may be a robotic or automated positioning system or apparatus. The means 64 may aim/position only a portion of the laser system or, as shown in FIG. 4, it may aim/position the entire system; in either case, the aiming/positioning means 64 is preferably microprocessor-controlled.

Figure 3:
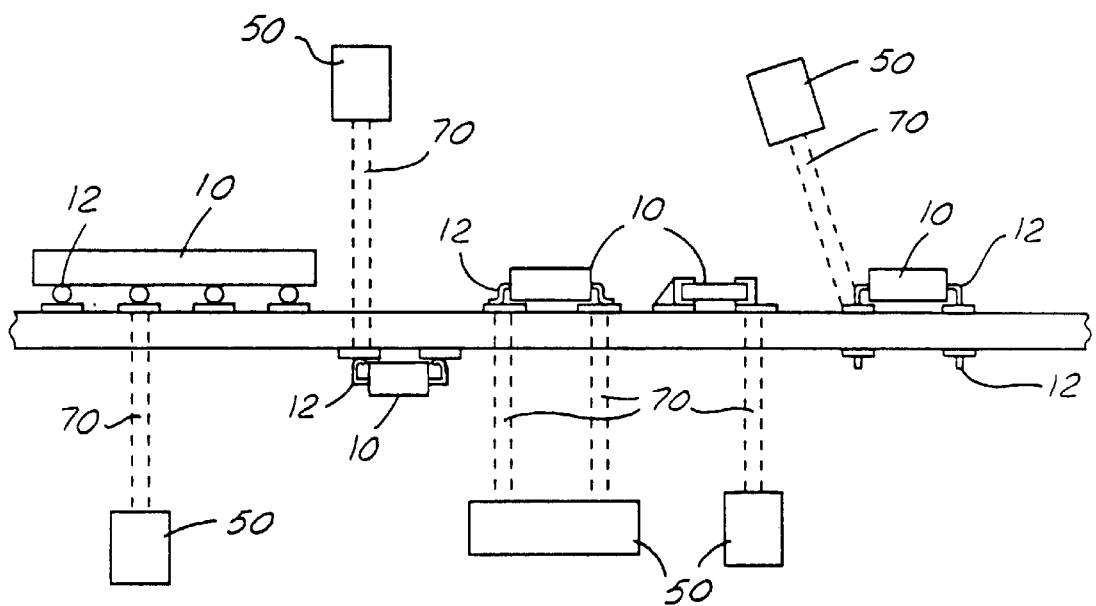

The system 50 may be completely contained on the second side 22 of the substrate, as illustrated in FIG. 2, or may be positioned with elements/sub-systems on both the first and second sides 18/22, as illustrated in FIG. 3. Regardless of the specific configuration used, the main requirement as to the positioning of the system 50 and its elements is that the laser beam 70 be incident on the substrate 14 on its second surface 20, as shown in FIGS. 2 and 3.

It should be understood that, as used herein, the "first" surface 16 refers to that surface of the substrate 14 on which a given component 10 is mounted/soldered, and that the "second" surface 20 refers to that substrate surface, opposite the first surface, onto which the laser energy is incident and through which the beam 70 passes to the underside surface (s) of the mounting pad(s) 24. Also, the "underside" surface of the electronic component 10 is that component surface which is mounted face-to-face with the substrate first surface 16. For example, the "underside" surface of a BGA, PGA, flip-chip, or similar component is that surface having balls (e.g., solder, gold), pins, bond pads, or other terminations thereon.

As described above, the present invention is described with respect to two-dimensional circuit board substrates. The circuit board substrates described above are generally planar and therefore two-dimensional. In the following figures, embodiments of a second method of the present invention are illustrated with respect to three-dimensional components. As will be illustrated, the use of three-dimensional components is particularly suitable for various automotive applications in which reducing the space occupied by such devices is desirable.

Figure 5:
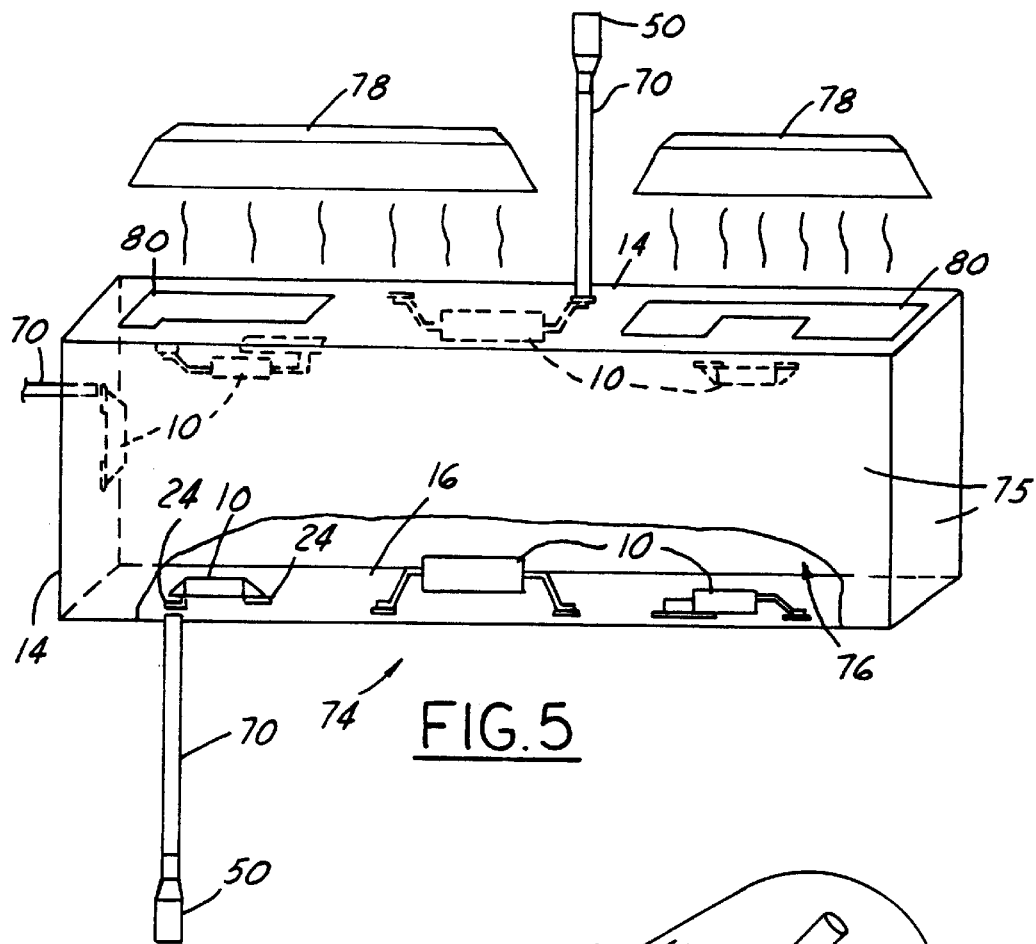
FIG. 5 is a perspective view of a first embodiment of a three dimensional electronic circuit assembly being laser soldered according to the present invention.

Referring now to FIG. 5, a dielectric circuit board substrate 14 has been formed to provide a three-dimensional shape. As illustrated, circuit board 14 has been formed into a housing 74. Housing 74 is rectangular in shape having six sides 75 and encloses components 10 therein. That is, electronic components 10 are located on first side 16 of substrate 14 which becomes an interior 76 of housing 74. Each of the sides 75 of housing 74 may have electrical components thereon.

To form a housing 74 according to this embodiment of the invention, a generally planar circuit board substrate 14 with terminations 12 and other circuit traces thereon is subjected to solder paste 26. That is, solder paste is placed on terminations 12 by conventional processes as described above. After solder has been screen printed or disposed by syringe upon the terminations, the components 10 are placed upon respective mounting pads 24. This may be done manually or by other known means such as robotic pick-and-place machines.

The circuit board substrate is then formed into the desired three-dimensional shape. The circuit board may also be formed prior to screen printing. The three-dimensional shape may fully enclose the components 10 therein such as illustrated in FIG. 5 by housing 74. As will be shown below, the substrate 14 may be formed into various useful shapes. Physical connections such as fasteners or heat staking may be used to hold the circuit substrate into its three-dimensional form.

After the circuit board substrate 14 has been formed into the desired three-dimensional shape, the terminations of component 10 are laser soldered to the mounting pads 24 as described above. That is, diode laser 50 emits a laser energy beam 70 that substantially passes through substrate 14. A plurality of diode lasers 50 may be used to simultaneously solder components to the various surfaces of housing 74.

The laser energy beam 70 melts the solder paste and when the molten solder paste is allowed to cool forms a bond between terminations 12 and mounting pads 24. Because the substrate 14 is formed into a three-dimensional component prior to soldering, the components 10 must be securely attached to the substrate to prevent them from becoming detached during processing. For relatively small components, the adhesion power of the solder paste is substantial enough to retain relatively small components therein during circuit board forming. However, for larger components, an additional means for securing the components 10 to substrate 14 may be used.

In one embodiment for securing the components 10 to substrate 14, a heater 78 may be used to heat the solder paste slightly to improve the adhesion between the terminations 12 and the mounting pads 14 prior to forming the circuit board. In addition to a heater 78, the components 10 may have a surface mount adhesive applied thereto prior to positioning on mounting pads 24. The adhesive, for example, may be a commonly used surface mount acrylic or other known adhesive.

A further enhancement to circuit, substrate 14 that increases rigidity and foldability may be provided. A reinforcement plate or plurality of reinforcement plates 80 may be bonded to or integrally formed with substrate 14. Reinforcement plate 80 is shaped to extend around adjacent areas on substrate 14 having mounting pads 24 thereon. This allows laser energy beam 70 to pass through the substrate 14. However, if reinforcement plate 80 is formed of a material that does not absorb laser energy beam 70, reinforcement plate 80 may extend over the area of mounting pads 24.

Figure 6:
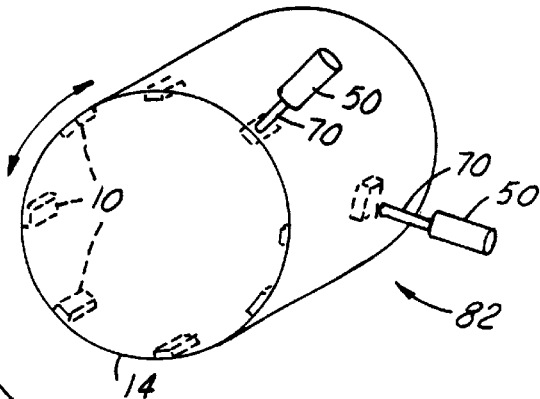
FIG. 6 is a perspective view of a second embodiment of a three dimensional electronic circuit assembly being laser soldered according to the present invention.

Referring now to FIG. 6, a tubular structure 82 has been formed by substrate 14. As shown, tubular structure 82 has a circular cross section. The circular cross section of tubular structure may, for example, be used for conduits within the automotive vehicle such as heating and air conditioning conduits. In a circular cross section of tubular structure, the substrate 14 may easily be rotated to a position suitable for laser welding by diode laser 50.

Figure 7:
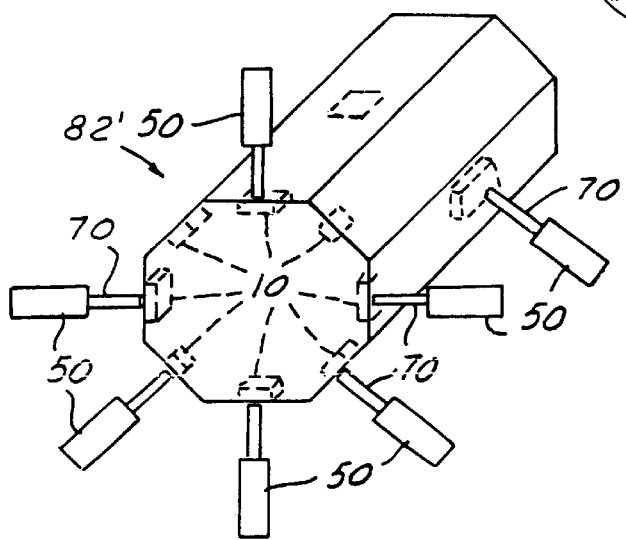
FIG. 7 is a perspective view of a third embodiment of a three dimensional electronic circuit assembly being laser soldered according to the present invention.

Referring now to FIG. 7, a hexagonal tubular structure 82' is illustrated. In this embodiment, discrete sides of tubular structure 82' are formed. A plurality of diode lasers 50 emitting laser energy beam 70 may be positioned around tubular structure 82'.

Figure 8:
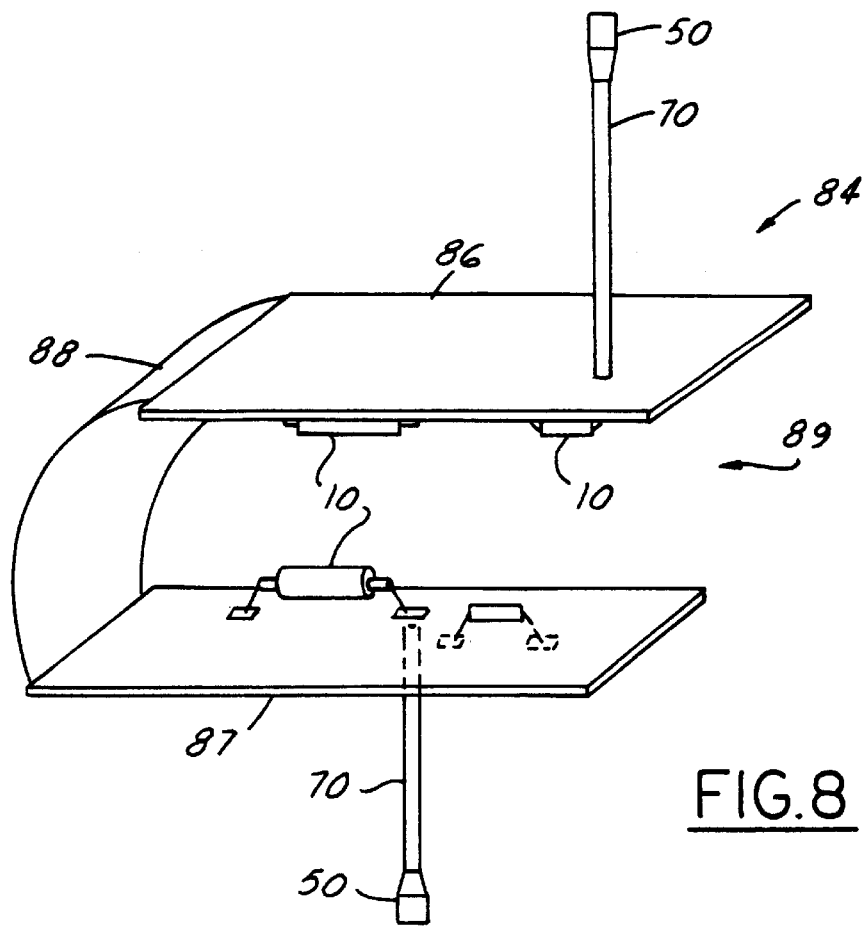
FIG. 8 is a perspective view of a fourth embodiment of a three dimensional electronic circuit assembly being laser soldered according to the present invention.

Referring now to FIG. 8, an open three-dimensional structure 84 is illustrated. Open structure 84 consists of a first substrate 86 and a second substrate 87. A flexible circuit 88 is used to electrically couple first substrate 86 and second substrate 87. An opening 89 is preferably large enough so that if desired, electrical components 10 may be placed upon substrates 86, 87 after open structure 84 has been formed. In this manner, a pick-and-place machine may be used to hold components 10 while laser beam 84 simultaneously laser solders the terminations of components 10 to the mounting pads 24.

Figure 9:
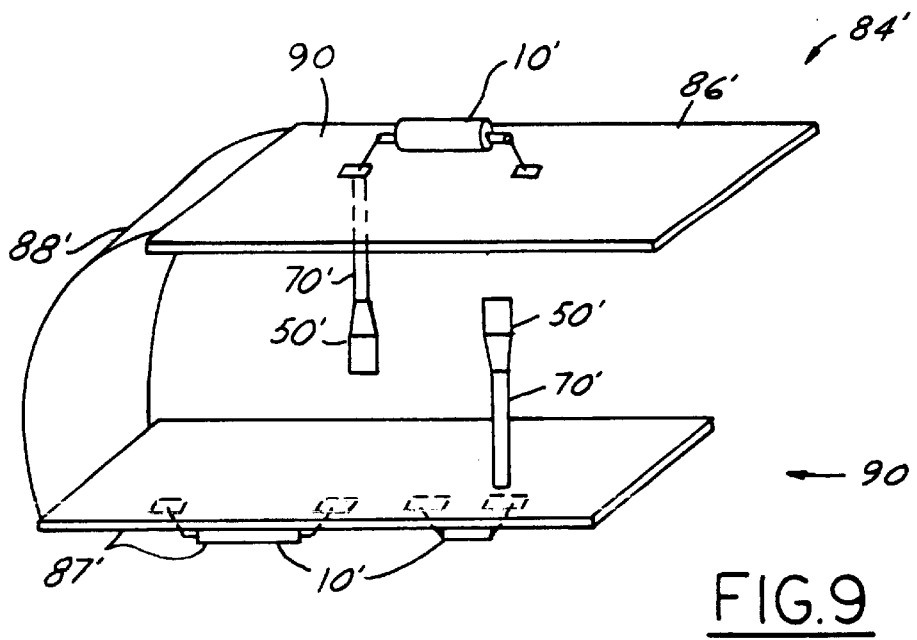
FIG. 9 is a perspective view of a fifth embodiment of a three dimensional electronic circuit assembly being laser soldered according to the present invention.

Referring now to FIG. 9, an alternative embodiment to FIG. 8 is shown. In this embodiment, components 10 are located on an outside surface 90 of open structure 84'. In this manner, laser diode 70 is positioned within opening 89 to laser solder components 10 to mounting pads 24.

Various other modifications to the present invention will, no doubt, occur to those skilled in the art to which the present invention pertains. For example, the first, second, and third steps described above can be combined into a single step of providing the component(s) 10, substrate/pads/paste 14/24/26, and diode laser system 50. Also, one or both sides 18/22 of the substrate 14 may be populated with components 10, and the laser beam 70 may be used conventionally (i.e., to line-of-sight laser solder components 10 positioned on the same side of the substrate as the beam emitter 60), or according to the present invention (i.e., to laser solder components positioned on the side/surface of the substrate opposite the side/surface above which the beam emitter 60 is positioned), or both, as desired. When laser soldering according to the present invention is performed on both sides of a substrate, as illustrated in FIG. 3, a given side of the substrate may be a "first" side with respect to a particular component, and yet that same side of the substrate may be a "second" side with respect to another component. Thus, it should be apparent that the terms "first" and "second" are relative to a given component rather than being necessarily fixed with respect to all components. The solder paste may be dispensed after the three-dimensional shape has been formed. Other modifications not specifically mentioned herein are also possible and within the scope of the present invention. It is the following claims, including all equivalents thereof, which define the scope of the present invention.

What is claimed is:

1. A method for laser soldering, comprising the steps of:
   providing an electronic component having at least two terminations thereon; a substantially flat dielectric substrate having a first surface on a first side thereof, a second surface on a second side thereof, and at least two mounting pads arranged on the first surface in matched relation with the terminations of the electronic component; and a diode laser;
   depositing solder paste atop the mounting pads;
   placing the electronic component atop the substrate such that each termination rests generally atop its respective mounting pad;
   forming a three dimensional structure from said substrate; and
   after the step of forming a three-dimensional structure, directing laser energy from the diode laser to at least one of the mounting pads from the second side of the substrate for a predetermined time, such that the solder paste atop the at least one of the mounting pads is melted.

2. A method according to claim 1, wherein the electronic component is selected from the group of a ball grid array, a pin grid array component and a surface mount component.

3. A method according to claim 1, wherein the dielectric substrate is made of a material selected from the group consisting of: epoxy; rigid to semi-rigid molded, cast or laminated polymer; and flexible molded, cast or laminated polymer.

4. A method according to claim 1, further comprising the step of allowing a solid solder joint to form atop each of the at least one of the mounting pads immediately after said step of directing laser energy, such that each solder joint mechanically and electrically connects its respective component termination with its respective mounting pad.

5. A method according to claim 1, wherein said step of forming comprises forming said substrate so that said components are within said three dimensional shape.

6. A method according to claim 1, wherein said step of forming comprises forming said substrate into a tube shape.

7. A method according to claim 6, wherein said step of forming said substrate into a tube shape comprises forming said substrate into a tube shape having a cross-sectional shape selected from the group of circular, rectangular, hexagonal.

8. A method according to claim 1, wherein prior to the step of forming a three dimensional structure, securing said component to said substrate.

9. A method according to claim 8, wherein said step of securing said component to said substrate comprises drying said solder paste.

10. A method according to claim 8, wherein said step of securing said component to said substrate comprises applying an adhesive to said component prior to the step of placing the electronic component.

11. A method according to claim 1 wherein the step of forming is performed prior to the step of depositing solder paste.

12. A method of forming an electronic assembly, comprising the steps of:

providing a surface mount electronic component having at least two terminations on an underside surface thereof; a dielectric substrate having a first surface on a first side thereof, a second surface on a second side thereof, and at least two mounting pads arranged on the first surface in matched relation with the terminations of the electronic component; and a diode laser;

depositing solder paste atop the mounting pads;

placing the electronic component atop the substrate such that each termination rests generally atop its respective mounting pad;

securing said component to said substrate and thereafter, forming a circuit assembly housing from said substrate so that said first side is within said housing and said second side form an exterior of said housing; and directing laser energy from the diode laser to at least one of the mounting pads from the second side of the substrate for a predetermined time, such that the solder paste atop the at least one of the mounting pads is melted.

13. A method according to claim 12, wherein the electronic component is a ball grid array or pin grid array component.

14. A method according to claim 12, wherein the dielectric substrate is made of a material selected from the group consisting of: epoxy; rigid to semi-rigid molded, cast or laminated polymer; and flexible molded, cast or laminated polymer.

15. A method according to claim 12, further comprising the step of allowing a solid solder joint to form atop each of the at least one of the mounting pads immediately after said step of directing laser energy, such that each solder joint mechanically and electrically connects its respective component termination with its respective mounting pad.

16. A method according to claim 12, wherein said step of forming a circuit assembly housing comprises forming said substrate into a tube shape.

17. A method according to claim 12, wherein said step of securing said component to said substrate comprises drying said solder paste.

18. A method according to claim 17, wherein said step of securing said component to said substrate comprises applying an adhesive to said component prior to the step of placing the electronic component.

19. A method according to claim 12 wherein the step of forming is performed prior to the step of depositing solder paste.

20. A method for laser soldering, comprising the steps of:

providing an electronic component having at least two terminations thereon; a substantially flat dielectric substrate having a first surface on a first side thereof, a second surface on a second side thereof, and at least two mounting pads arranged on the first surface in matched relation with the terminations of the electronic component; and a diode laser;

depositing solder paste atop the mounting pads;

placing the electronic component atop the substrate such that each termination rests generally atop its respective mounting pad;

forming a three dimensional structure having from said substrate so that said second side in within said three dimensional structure;

after the step of forming a three-dimensional structure, directing laser energy from the diode laser to at least one of the mounting pads from the second side of the substrate for a predetermined time, such that the solder paste atop the at least one of the mounting pads is melted; and allowing a solid solder joint to form atop each of the at least one of the mounting pads immediately after said step of directing laser energy, such that each solder joint mechanically and electrically connects its respective component termination with its respective mounting pad.

21. A method as recited in claim 20, wherein said step of forming comprises the step of folding the substrate in a predetermined shape.

22. A method according to claim 20, wherein said step of forming comprises forming said substrate into a tube shape.

23. A method according to claim 22, wherein said step of forming said substrate into a tube shape comprises forming said substrate into a tube shape having a cross-sectional shape selected from the group of circular, rectangular, hexagonal.

24. A method according to claim 20, further comprising the step of securing said component to said substrate prior to the step of forming a three-dimensional substrate.

25. A method according to claim 20, wherein said step of securing said component to said substrate comprises drying said solder paste.

26. A method according to claim 20, wherein said step of securing said component to said substrate comprises applying an adhesive to said component prior to the step of placing the electronic component.

27. A method according to claim 20 wherein the step of forming is performed prior to the step of depositing solder paste.

* * * * *